US010385453B2

(12) United States Patent
Yonezawa et al.

(10) Patent No.: US 10,385,453 B2
(45) Date of Patent: Aug. 20, 2019

(54) FILM FORMING APPARATUS

(71) Applicant: TOKYO ELECTRON LIMITED, Tokyo (JP)

(72) Inventors: Masato Yonezawa, Oshu (JP); Shigehiro Miura, Oshu (JP); Hiroyuki Akama, Oshu (JP); Koji Yoshii, Oshu (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 214 days.

(21) Appl. No.: 15/240,316

(22) Filed: Aug. 18, 2016

(65) Prior Publication Data

US 2017/0051403 A1 Feb. 23, 2017

(30) Foreign Application Priority Data

Aug. 21, 2015 (JP) ................................ 2015-163512

(51) Int. Cl.
*C23C 16/52* (2006.01)
*C23C 16/46* (2006.01)
*C23C 16/455* (2006.01)
*C23C 16/458* (2006.01)

(52) U.S. Cl.
CPC .......... *C23C 16/46* (2013.01); *C23C 16/4584* (2013.01); *C23C 16/45536* (2013.01); *C23C 16/45551* (2013.01); *C23C 16/52* (2013.01)

(58) Field of Classification Search
CPC ....... C23C 16/455; C23C 16/52; C23C 16/46; C23C 16/4584; C23C 16/45551; C23C 16/45536
See application file for complete search history.

(56) References Cited

U.S. PATENT DOCUMENTS

2014/0326186 A1 11/2014 Paranjpe et al.

FOREIGN PATENT DOCUMENTS

| | | | |
|---|---|---|---|
| CN | 102317501 | A | 1/2012 |
| CN | 102796997 | A | 11/2012 |
| CN | 103320762 | A | 9/2013 |
| JP | H06-177116 | A | 6/1994 |
| JP | 2000-064029 | A | 2/2000 |
| JP | 2000-188261 | A | 7/2000 |
| JP | 2001-210596 | A | 8/2001 |
| JP | 2003-257873 | A | 9/2003 |
| JP | 2003-282461 | A | 10/2003 |
| JP | 2012-248634 | A | 12/2012 |

*Primary Examiner* — Yuechuan Yu

(74) *Attorney, Agent, or Firm* — Nath, Goldberg & Meyer; Jerald L. Meyer

(57) ABSTRACT

A film forming apparatus for performing a predetermined film forming process on a substrate mounted on an upper surface of a rotary table installed within a process vessel while rotating the rotary table and heating the substrate by a heating part, includes: a contact type first temperature measuring part configured to measure a temperature of the heating part; a non-contact type second temperature measuring part configured to measure a temperature of the substrate; and a control part configured to control a power supplied to the heating part based on at least one among a first measurement value measured by the first temperature measuring part and a second measurement value measured by the second temperature measuring part. The control part changes a method for controlling the power when the predetermined film forming process is performed on the substrate and when the substrate is loaded into or unloaded from the process vessel.

3 Claims, 6 Drawing Sheets

FILM FORMING APPARATUS

CROSS-REFERENCE TO RELATED APPLICATION

This application claims the benefit of Japanese Patent Application No. 2015-163512, filed on Aug. 21, 2015, in the Japan Patent Office, the disclosure of which is incorporated herein in its entirety by reference.

TECHNICAL FIELD

The present disclosure relates to a film forming apparatus.

BACKGROUND

There is known a film forming apparatus in which a plurality of wafers is mounted on a rotary table installed within a process vessel in a rotational direction of the rotary table.

The film forming apparatus includes a gas supply part installed in a diameter direction of the rotary table to supply a process gas, and a heater installed below the rotary table to heat the wafers. Further, in a state where the wafers are heated by the heater and the process gas is discharged from the gas supply part, the film forming process is performed on the wafers by rotating the rotary table. Also, in the film forming apparatus, a temperature control is performed by controlling a power supplied to the heater based on a temperature measured by a thermocouple installed near the heater.

Further, in a film forming apparatus in which a plurality of wafers is mounted on a rotary table installed within a process vessel in a rotational direction of the rotary table, there is known a technique of measuring a temperature of the rotary table or the wafer using a non-contact type temperature measuring part.

However, in the case of controlling the power supplied to the heater based on the temperature measured by the thermocouple installed near the heater, when the film forming process such as a plasma process or the like is performed on the wafers, a significant difference may occur between the temperature of the wafer and the temperature measured by the thermocouple. Such a temperature difference may occur because the wafers are exposed to plasma while the thermocouple is not exposed to plasma.

Accordingly, in the case of performing the temperature control by controlling the power supplied to the heater based on the temperature measured by the thermocouple, there is a possibility that the temperature control may not be performed with high precision.

SUMMARY

Some embodiments of the present disclosure provide a film forming apparatus which is capable of performing a temperature control with high precision.

According to one embodiment of the present disclosure, there is provided a film forming apparatus for performing a predetermined film forming process on a substrate mounted on an upper surface of a rotary table installed within a process vessel while rotating the rotary table and heating the substrate by a heating part, including: a contact type first temperature measuring part configured to measure a temperature of the heating part; a non-contact type second temperature measuring part configured to measure a temperature of the substrate mounted on the rotary table; and a control part configured to control a power supplied to the heating part based on at least one among a first measurement value measured by the first temperature measuring part and a second measurement value measured by the second temperature measuring part. The control part is configured to change a method for controlling the power supplied to the heating part when the predetermined film forming process is performed on the substrate and when the substrate is loaded into or unloaded from the process vessel.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
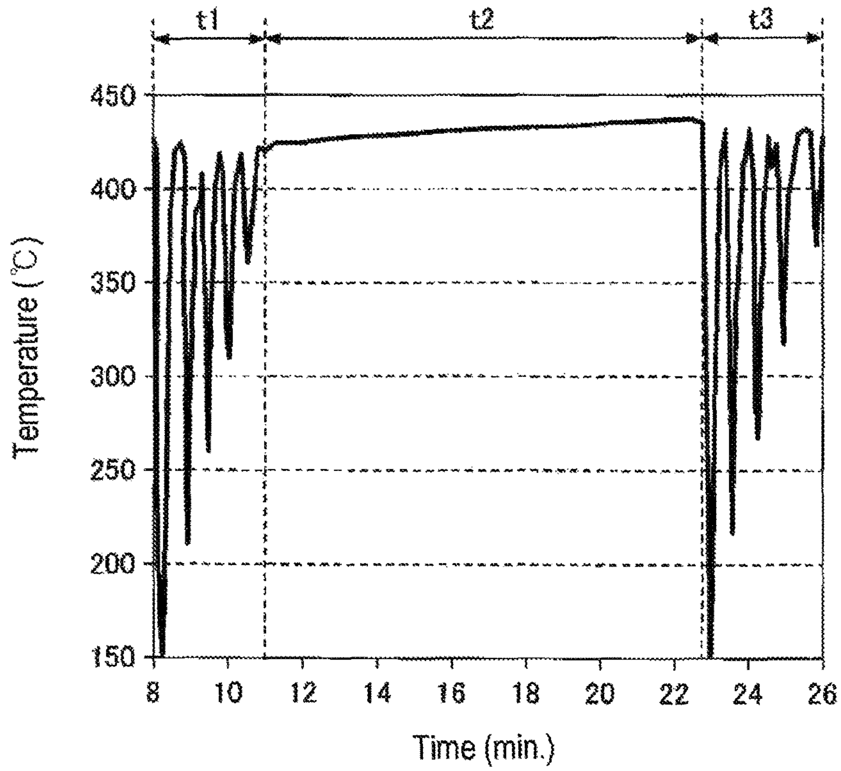
FIG. 1 is a graph illustrating the results obtained when a temperature of a wafer is measured by a non-contact type temperature measuring part.

Reference will now be made in detail to various embodiments, examples of which are illustrated in the accompanying drawings. In the specification and drawings, like reference numerals will be assigned to like parts having substantially the same functions and duplicate descriptions thereof will be omitted. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

As a method for controlling a temperature with high precision, a method of measuring a temperature of a wafer by a non-contact type temperature measuring part and controlling the temperature based on the measurement value may be considered. In this method, a film forming process such as a plasma process or the like is performed on the wafer. Thus, even when a significant difference occurs between the temperature of the wafer and a temperature measured by a thermocouple, the temperature of the wafer can be measured with high precision by the non-contact type temperature measuring part. Further, since the temperature control is performed based on the measured temperature of the wafer, the temperature control can be performed with high precision.

However, if the temperature control is performed based on the measurement value measured by the non-contact type temperature measuring part, for example, when the wafer is loaded into a process vessel, a temperature of the wafer immediately after the wafer is loaded into the process vessel is measured. Accordingly, as illustrated in FIG. 1, when the wafer is loaded into the process vessel (time t1 and time t3 of FIG. 1), a temperature measured by the non-contact type temperature measuring part significantly fluctuates compared with a time (time t2 of FIG. 1) when the wafer is subjected to the film forming process. Further, since the temperature control is performed based on the significantly fluctuated measurement value, the temperature control may not be performed with high precision when the wafer is loaded.

Also, FIG. 1 is a graph illustrating the results obtained when the temperature of the wafer is measured by the non-contact type temperature measuring part in a state where a power supplied to the heater is uniformly maintained, in which the horizontal axis represents time (min.) and the vertical axis represents temperature (degrees C.). Also, in FIG. 1, the time t1 and the time t3 represent times at which the wafer is loaded into the process vessel, and the time t2 represents a time at which the film forming process is performed on the wafer within the process vessel.

(Film Forming Apparatus)

Figure 2:
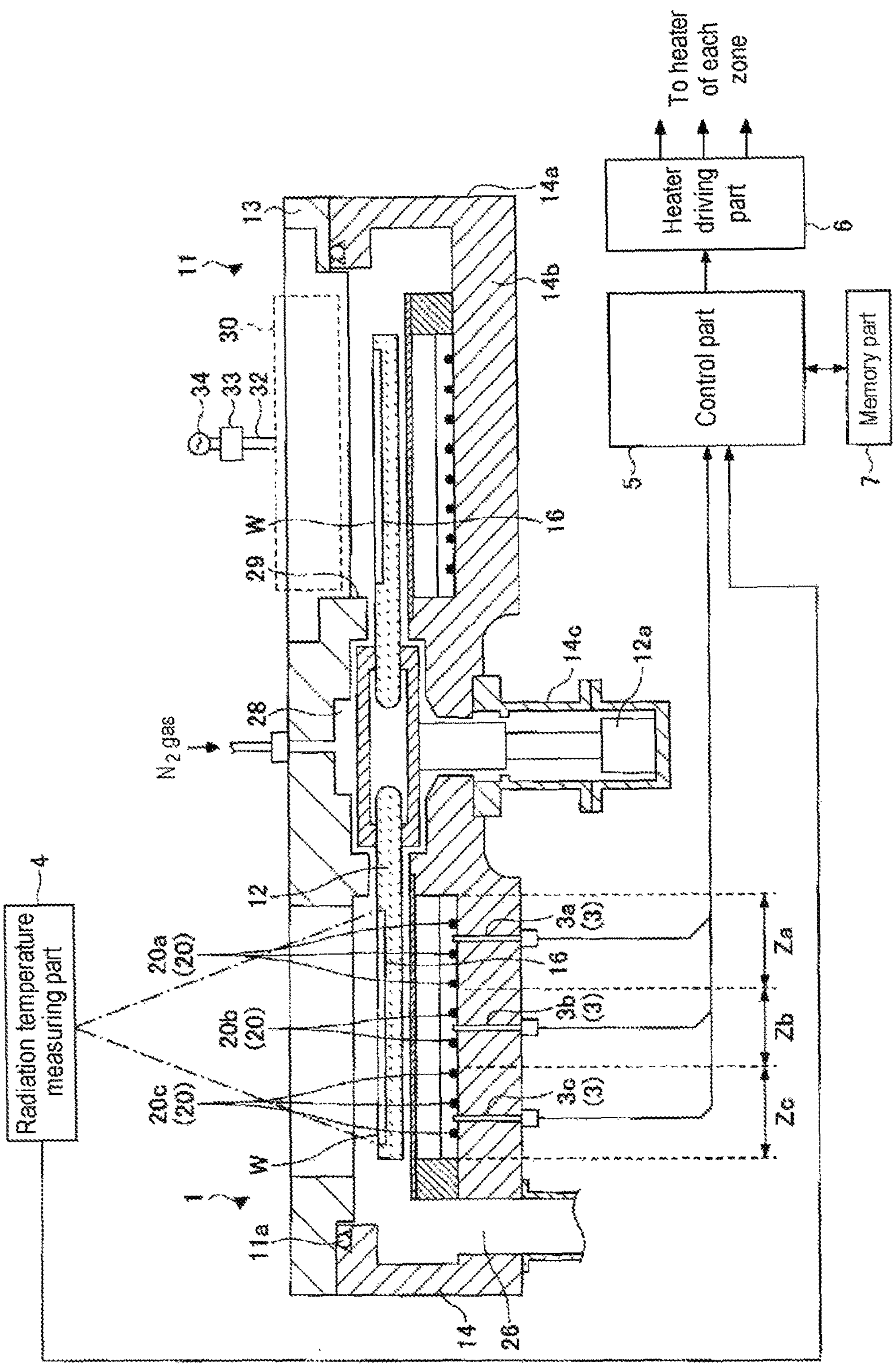
FIG. 2 is a schematic longitudinal cross-sectional view of a film forming apparatus according to an embodiment of the present disclosure.
Figure 3:
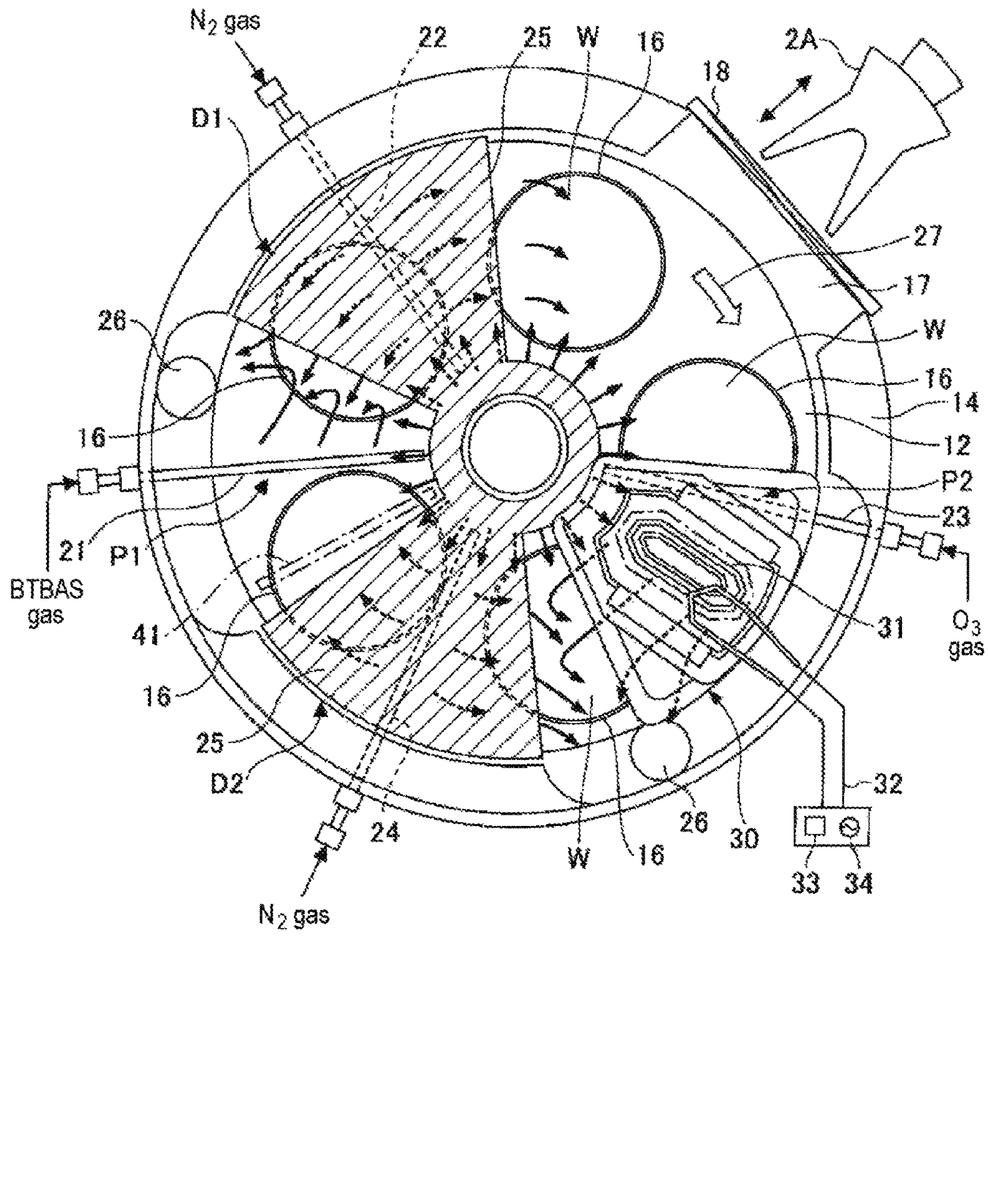
FIG. 3 is a schematic plan view of the film forming apparatus according to the embodiment of the present disclosure.

An example of a film forming apparatus of an embodiment of the present disclosure will be described. FIG. 2 is a schematic longitudinal cross-sectional view of the film forming apparatus according to the embodiment of the present disclosure, and FIG. 3 is a schematic plan view of the film forming apparatus according to the embodiment of the present disclosure. Also, in FIG. 3, the illustration of a ceiling plate is omitted for the sake of convenience in description.

The film forming apparatus 1 of the embodiment of the present disclosure includes a flat process vessel 11 which has a substantially circular shape, and a disc-shaped rotary table 12 horizontally installed within the process vessel 11. The rotary table 12 is rotatable in a circumferential direction by a rotation driving mechanism 12*a*. Further, an arrow 27 of FIG. 3 indicates a rotational direction of the rotary table 12.

The process vessel 11 is a vacuum vessel which is installed in the air atmosphere and includes a ceiling plate 13 and a vessel body 14. A ring-shaped seal member 11*a* is installed in a peripheral portion of an upper surface of the vessel body 14. The ceiling plate 13 is hermetically installed in the vessel body 14 via the seal member 11*a*. The vessel body 14 includes a sidewall 14*a*, a bottom portion 14*b*, and a cover 14*c* of the process vessel 11. The cover 14*c* receives the rotation driving mechanism 12*a*. A flange portion of an upper surface of the cover 14*c* is hermetically installed in a lower surface of the bottom portion 14*b* of the process vessel 11.

Five concave portions 16 are formed in an upper surface of the rotary table 12 along the rotational direction of the rotary table 12. As illustrated in FIG. 3, a transfer port 17 through which the wafer W is transferred between a transfer mechanism 2A and the rotary table 12 is formed in the sidewall 14*a* of the vessel body 14. The transfer port 17 is configured to be hermetically opened and closed by a gate valve 18. The wafer W is an example of a substrate. For example, a silicon substrate may be used as the wafer W.

A first reaction gas nozzle 21, a separation gas nozzle 22, a second reaction gas nozzle 23, and a separation gas nozzle 24, each having a bar shape and extending from an outer periphery of the rotary table 12 toward the center thereof, are disposed in this order along a circumferential direction on the rotary table 12. Each of these gas nozzles 21 to 24 includes downwardly-opened openings through which a gas is supplied along a diameter of the rotary table 12. The first reaction gas nozzle 21 discharges a bistertiarybutylaminosilane (BTBAS) gas, and the second reaction gas nozzle 23 discharges an ozone ($O_3$) gas. Each of the separation gas nozzles 22 and 24 discharges a nitrogen ($N_2$) gas.

A region below the first reaction gas nozzle 21 is a first process region P1 where the BTBAS gas is adsorbed onto the wafer W. A region below the second reaction gas nozzle 23 is a second process region P2 where an Si component contained in the BTBAS gas adsorbed onto the wafer W is oxidized by plasma of the $O_3$ gas. Regions below the separation gas nozzles 22 and 24 constitute separation regions D1 and D2 by which the first process region P1 and the second process region P2 are separated, respectively.

The ceiling plate 13 of the process vessel 11 includes two protruding portions 25 which protrude downward and have a fan shape. These protruding portions 25 are formed at an interval in a circumferential direction. Each of the separation gas nozzles 22 and 24 is embedded in the respective protruding portion 25 to divide the respective protruding portion 25 in the circumferential direction. The first reaction gas nozzle 21 and the second reaction gas nozzle 23 are installed to be spaced apart from the protruding portions 25.

A plasma generating part 30 for plasmizing the $O_3$ gas discharged into the process vessel 11 is installed above the second reaction gas nozzle 23. The plasma generating part 30 is formed by winding an antenna 31 formed of a metal wire or the like, for example, around a vertical axis, trebly to have a coil shape. In addition, the plasma generating part 30 is disposed to span across a diameter portion of the wafer W on the rotary table 12 in plan view.

The antenna 31 is connected to a matcher 33 and a high-frequency power source 34 via a connection electrode 32. The high-frequency power source 34 is a power source having a frequency of, for example, 13.56 MHz, and an output power of, for example, 5,000 W. Further, the antenna 31 is installed to be hermetically partitioned from the internal region of the process vessel 11.

Heaters 20 are installed below the rotary table 12. The heaters 20 are an example of a heating part for heating the wafers W mounted on the rotary table 12. Specifically, the heaters 20 are concentrically disposed around the rotational center of the rotary table 12. An example of the heaters 20 may include a resistive heater or an inductive heater such as a metal wire heater, a molybdenum heater, a carbon wire heater, or the like.

A heating region in the process vessel 11 is partitioned into a plurality of zones to control a temperature in the diameter direction of the rotary table 12. In FIG. 2, the heating region in the process vessel 11 is partitioned into three zones Za, Zb, and Zc sequentially from the side close to the rotational center of the rotary table 12. Also, the heaters 20 is partitioned into three zone heaters 20*a*, 20*b*, and 20*c* to correspond to the zones Za, Zb, and Zc such that they can be individually controlled. While in FIG. 2, the heating region in the process vessel 11 has been described to be partitioned into three zones, the present disclosure is not limited thereto. In some embodiments, the heating region may be determined depending on a size of the process vessel 11, a size of the wafer W, or the like.

Three thermocouples 3*a*, 3*b*, and 3*c* for measuring the temperature are installed near the zone heaters 20*a*, 20*b*, and 20*c*, respectively. Hereinafter, the three thermocouples 3*a*, 3*b*, and 3*c* may be simply referred to as a thermocouple 3.

The thermocouple 3 is an example of a contact type first temperature measuring part for measuring a temperature of the heater 20. Specifically, one end of each of the thermocouples 3a, 3b, and 3c hermetically pass through the bottom portion 14b of the vessel body 14 from below the vessel body 14 and inserted up to below the rotary table 12. The other end of each of the thermocouples 3a, 3b, and 3c is connected to a control part 5. A measurement value measured by each of the thermocouples 3a, 3b, and 3c is inputted to the control part 5.

An exhaust port 26, which is opened at a position toward an outer side of the rotary table 12 in the diameter direction of the rotary table 12 from a region between the separation region D1 and the separation region D2 defined below the protruding portions 25, is formed in the bottom portion 14b of the vessel body 14. The exhaust port 26 is to exhaust the BTBAS gas, the $O_3$ gas, the $N_2$ gas or the like, and is connected to a vacuum pump by an exhaust pipe in which a pressure regulating part such as a butterfly valve or the like is installed.

The $N_2$ gas is supplied to a space 28 as a central region of a lower surface of the ceiling plate 13. The supplied $N_2$ gas is supplied to the outer side of the rotary table 12 in the diameter direction through below a downwardly-protruded portion 29 of a ring shape. This makes it possible to suppress the BTBAS gas and the O3 gas from being mixed in the central region. In FIG. 3, flows of gases at the time of the film forming process are indicated by arrows. Also, although not shown, the $N_2$ gas may be also supplied to the interior of the cover 14c and the lower surface of the rotary table 12 such that a reaction gas is purged.

Figure 4:
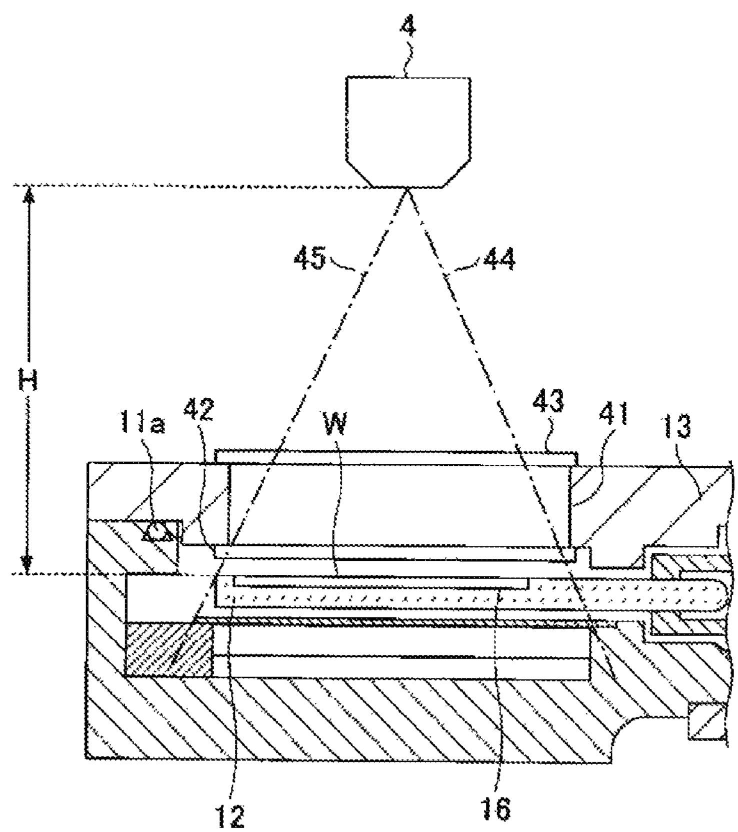
FIG. 4 is a partial cross-sectional view illustrating a radiation temperature measuring part in the film forming apparatus according to the embodiment of the present disclosure.

Next, the present disclosure will be described with reference to FIG. 4 illustrating an enlarged view of a longitudinal side of the ceiling plate 13 and the rotary table 12. FIG. 4 is a partial cross-sectional view illustrating a radiation temperature measuring part in the film forming apparatus 1 of the embodiment of the present disclosure. Specifically, FIG. 4 illustrates a cross-section between the first process region P1 in which the first reaction gas nozzle 21 is installed and the separation region D2 adjacent to an upstream side of the first process region P1 in the rotational direction.

A slit 41 extending in the diameter direction of the rotary table 12 is opened at a position indicated by a dashed dotted line in FIG. 3 in the ceiling plate 13. A lower window 42 and an upper window 43 are installed to cover upper and lower portions of the slit 41, respectively. The lower window 42 and the upper window 43 are formed of, for example, sapphire such that an infrared ray radiated from the upper side of the rotary table 12 can be transmitted therethrough and a temperature can be measured by the radiation temperature measuring part 4. The upper side of the rotary table 12 also includes the upper side of the wafer W.

The radiation temperature measuring part 4 is installed above the slit 41. The radiation temperature measuring part 4 is an example of a non-contact type second temperature measuring part for measuring a temperature of the wafer W mounted on the rotary table 12 in a state where the rotary 12 is being rotated.

A height H from the upper surface of the rotary table 12 of FIG. 4 to a lower end of the radiation temperature measuring part 4 is, for example, 500 mm. The radiation temperature measuring part 4 induces an infrared ray radiated from the temperature measurement region of the rotary table 12 to a detection part 401 (to be described later). The detection part 401 obtains a measurement value corresponding to an amount of the infrared ray. Thus, the measurement value is different depending on the temperatures of positions from which the measurement value is obtained. The measurement value thus obtained is sequentially transmitted to the control part 5.

Figure 5A:
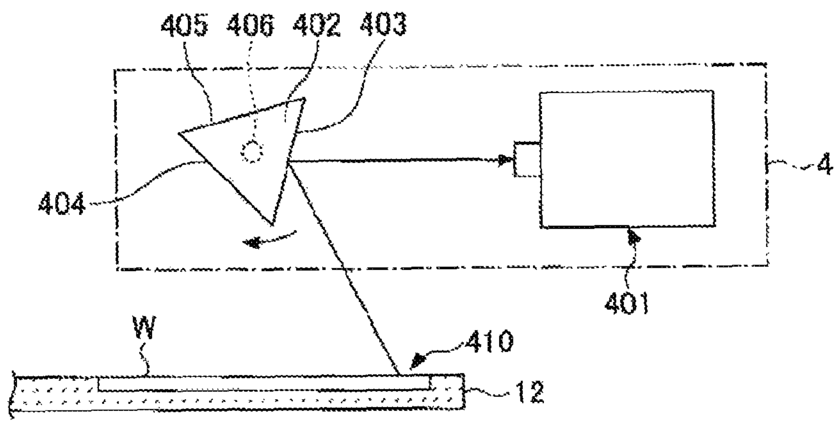
FIGS. 5A to 5C are views illustrating an operation of the radiation temperature measuring part.
Figure 5B:
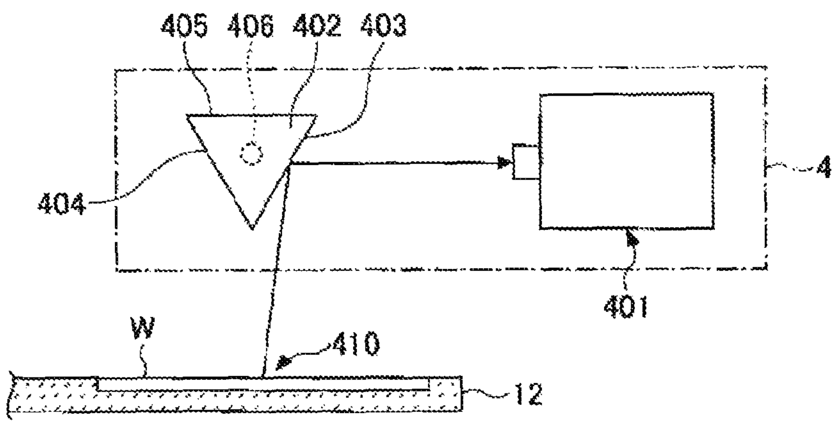
Figure 5C:
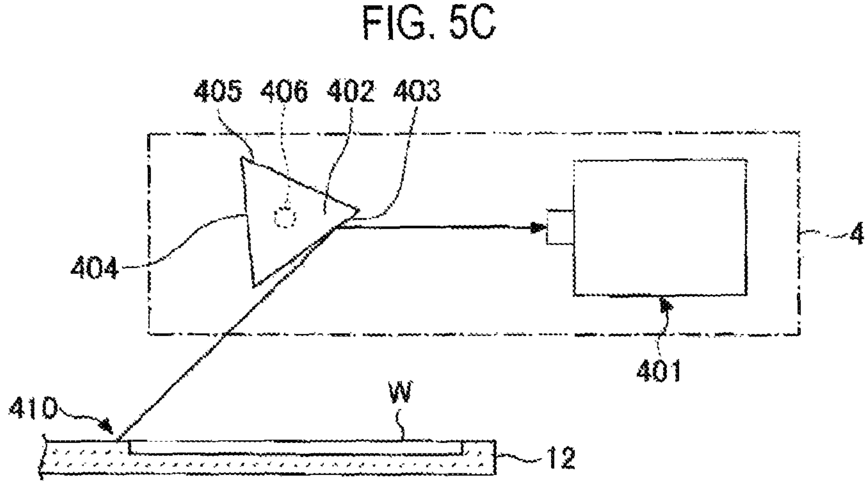

Next, an operation of the radiation temperature measuring part 4 will be described with reference to FIG. 5. FIG. 5 is a view illustrating the operation of the radiation temperature measuring part 4.

As illustrated in FIG. 5, the radiation temperature measuring part 4 includes a rotor 402 configured as a servo motor rotating at 50 Hz. The rotor 402 has a triangular shape in plan view. Three sides of the rotor 402 are defined as reflective surfaces 403 to 405. As illustrated in FIG. 5, as the rotor 402 rotates about a rotary shaft 406, an infrared ray of the temperature measurement region 410 of the rotary table 12 including the wafer W is reflected at any one of the reflective surfaces 403 to 405 as indicated by the arrow in FIG. 5 and induced to the detection part 401. A position of the temperature measurement region 410 is moved in the diameter direction of the rotary table 12 and then scanned.

The detection part 401 is configured to continuously receive the infrared ray reflected at one reflective surface a predetermined number of times (for example, 128 times) and to detect temperatures of predetermined positions (for example, 128 positions) of the rotary table 12 in the diameter direction. Further, with the rotation of the rotor 402, the reflective surfaces 403 to 405 are sequentially positioned along an optical path of the infrared ray, thereby repeatedly performing the scanning operation from an inner side of the rotary table 12 toward the outer side thereof. A scanning speed is 150 Hz. That is to say, the radiation temperature measuring part 4 may perform the scanning operation 150 times per second. Further, the temperature measurement region 410 is a spot having a diameter of 5 mm. The scanning operation is performed in a range from a position more inward of a concave portion 16 of the rotary table 12 on which the wafer W is mounted to an outer peripheral end of the rotary table 12. In FIG. 4, dashed dotted lines 44 and 45 indicate paths of the infrared ray that orients to the radiation temperature measuring part 4 from the temperature measurement regions 410 when the temperature measurement regions 410 moves to the innermost and outermost peripheral sides of the rotary table 12.

Figure 6:
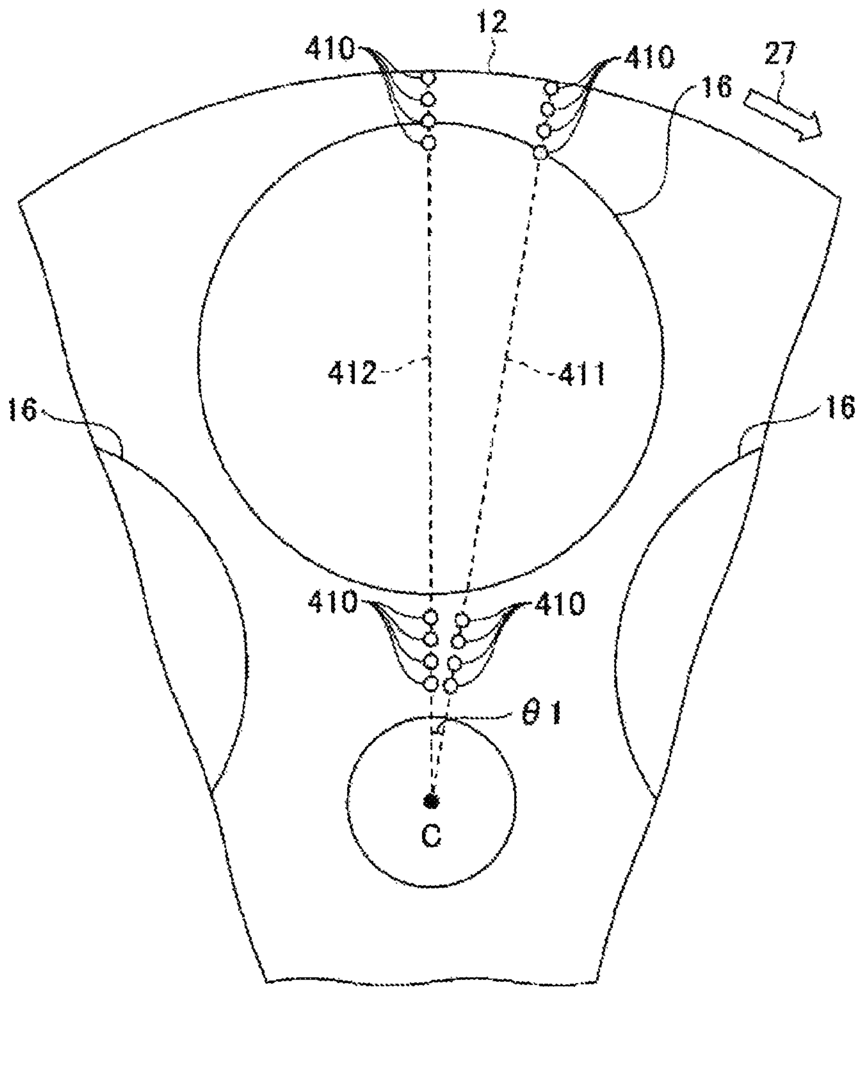
FIG. 6 is a view illustrating a relationship between a rotary table and a temperature measurement region.

The scanning operation by the radiation temperature measuring part 4 is performed in a state where the rotary table 12 is being rotated. In this embodiment, a rotational speed of the rotary table 12 is 240 revolutions per minute. FIG. 6 is a plan view illustrating the relationship between the rotary table 12 and the temperature measurement region 410. In FIG. 6, reference numeral 411 designates a row (scan line) of the temperature measurement region 410 when an nth (n is an integer) scanning operation is performed outward from inward of the rotary table 12 in a state where the rotary table 12 is rotated. In FIG. 6, reference numeral 412 designates a scan line when an (n+1)th (n is an integer) scanning operation is performed. With the rotation of the rotary table 12, a central angle between the scan lines 411 and 412 with respect to a rotational center C of the rotary table 12 is offset by an angle Θ1 corresponding to the rotational speed of the rotary table 12. By repeating the scanning operation while rotating the rotary table 12 as described above, measurement values at a plurality of positions on the rotary table 12 are sequentially acquired. Further, the arrow 27 of FIG. 6 indicates the rotational direction of the rotary table 12.

The control part 5 drives a heater driving part 6 based on at least one among a measurement value measured by the thermocouple 3 and a measurement value measured by the radiation temperature measuring part 4, and controls a power supplied to the heater 20. The measurement value measured by the thermocouple 3 is an example of a first measurement value, and the measurement value measured by the radiation temperature measuring part 4 is an example of a second measurement value.

Also, in FIG. 2, a memory part 7 is a memory for storing parameters of a PID control (to be described later) and the like.

(Film Forming Method)

An example of a film forming method performed by the film forming apparatus according to an embodiment of the present disclosure will be described.

<Loading Process>

First, the gate valve 18 installed in the transfer port 17 is opened and the wafer W is transferred into the concave portion 16 of the rotary table 12 from the outside of the process vessel 11 through the transfer port 17 by the transfer mechanism 2A. This transfer is performed by moving up and down lifting pins (not shown) from a lower side of the process vessel 11 via through holes formed in a lower surface of the concave portion 16 when the concave portion 16 is positioned to face the transfer port 17. The transfer of the wafer W is performed by intermittently rotating the rotary table 12. In this way, the wafers W are loaded into each of the five concave portions 16 of the rotary table 12.

<Film Forming Process>

Subsequently, the gate valve 18 is closed and the interior of the process vessel 11 is vacuumized by a vacuum pump (not shown) connected to the exhaust port 26. The $N_2$ gas as the separation gas is discharged from the separation gas nozzles 22 and 24 at a predetermined flow rate. Further, the $N_2$ gas is supplied to the space 28 as the central region of the rotary table 12. Accordingly, the interior of the process vessel 11 is adjusted to a preset pressure by a pressure regulating part (not shown) connected to the exhaust port 26.

Thereafter, the wafer W is heated to, for example, 400 degrees C. by the heater 20 while rotating the rotary table 12 in a clockwise direction (direction indicated by the arrow 27 in FIG. 3). The BTBAS gas is supplied from the first reaction gas nozzle 21 and the $O_3$ gas is supplied from the second reaction gas nozzle 23. Further, in the plasma generating part 30, the high-frequency power source 34 applies a high-frequency power of a predetermined output to the antenna 31.

Then, when the wafer W passes through the first process region P1, the BTBAS gas as a raw material gas is supplied from the first reaction gas nozzle 21 such that the BTBAS gas is adsorbed onto the surface of the wafer W. The wafer W with the BTBAS gas adsorbed to the surface thereof is purged by passing through the separation region D1 in which the separation gas nozzle 22 is installed, with the rotation of the rotary table 12, and subsequently, enters into the second process region P2.

In the second process region P2, the $O_3$ gas is supplied from the second reaction gas nozzle 23 to oxidize an Si component contained in the BTBAS gas by the $O_3$ gas. Thus, a silicon dioxide ($SiO_2$) as a reaction product is deposited on the surface of the wafer W. The wafer W that passes through the second process region P2 is purged by passing through the separation region D2 in which the separation gas nozzle 24 is installed, and subsequently, re-enters into the first process region P1.

In the first process region P1, the BTBAS gas is supplied from the first reaction gas nozzle 21 and again adsorbed onto the surface of the wafer W.

In this manner, the BTBAS gas is adsorbed onto the surface of the wafer W in the first process region P1 with the rotation of the rotary table 12, and the BTBAS gas adsorbed onto the wafer W is oxidized by plasma of the $O_3$ gas in the second process region P2. Accordingly, a molecular layer of the silicon oxide film ($SiO_2$ film) is formed in a single layer or plural layers so that the reaction product is formed.

Further, in the film forming process, the $N_2$ gas supplied to the separation regions D1 and D2 from the separation gas nozzles 22 and 24 spread inside the separation regions D1 and D2 in a circumferential direction such that the BTBAS gas and the $O_3$ gas is suppressed from being mixed with each other on the rotary table 12. Also, surplus BTBAS gas and $O_3$ gas are allowed to flow to the exhaust port 26. Also, the $N_2$ gas supplied to the space 28 as the central region of the rotary table 12 is supplied outward of the rotary table 12 in the diameter direction through below the downwardly-protruded ring-shaped portion 29. This suppresses the BTBAS gas and the $O_3$ gas from being mixed with each other in the central region. Also, although not shown, the $N_2$ gas is also supplied into the cover 14*c* and below the rotary table 12 to purge the BTBAS gas and the $O_3$ gas.

<Unloading Process>

After the reaction product having a desired film thickness is formed on the surface of the wafer W, the supply of the gas to the process vessel 11 is stopped, the rotation of the rotary table 12 is stopped, and the wafers W are unloaded from the interior of the process vessel 11 in a reverse order of the order when the wafers W are loaded into the process vessel 11.

In this manner, the film forming method by the film forming apparatus of the embodiment of the present disclosure is completed.

(Temperature Control Method)

A temperature control method performed by the film forming apparatus of the embodiment of the present disclosure will be described.

In this embodiment, as illustrated in FIG. 2, during the loading process, the film forming process, and the unloading process, a temperature of the wafer W is measured by the radiation temperature measuring part 4, and the measurement value is inputted to the control part 5. Also, a temperature of the heater 20 is measured by the thermocouple 3, and the measurement value is inputted to the control part 5.

The temperature control method performed by the film forming apparatus of the embodiment of the present disclosure features that the control part 5 changes a method for controlling a power supplied to the heater 20 when a predetermined film forming process is performed on the wafer W and when the wafer W is loaded into or unloaded from the process vessel 11. Hereinafter, a specific example of the method for controlling a power supplied to the heater 20 by the control part 5 will be described. However, the present disclosure is not limited to the following examples.

First Embodiment

In this embodiment, when the predetermined film forming process is performed on the wafer W, the control part 5 controls a power supplied to the heater 20 by performing a feedback control such that a measurement value measured by the radiation temperature measuring part 4 is maintained at a predetermined temperature. Further, when the wafer W is loaded into or unloaded from the process vessel 11, the control part 5 controls the power supplied to the heater 20 by performing the feedback control such that a calculation value calculated based on the measurement value measured by the thermocouple 3 and the measurement value measured by the radiation temperature measuring part 4 is maintained at a predetermined temperature.

Specifically, in the film forming process, the control part 5 performs the feedback control such that the measurement value measured by the radiation temperature measuring part 4 is maintained at a predetermined temperature (for example, 400 degrees C.), thus driving the heater driving part 6 and controlling the power supplied to the heater 20.

In the loading and unloading processes, the control part 5 performs the feedback control such that the calculation value calculated based on the measurement value measured by the thermocouple 3 and the measurement value measured by the radiation temperature measuring part 4 is maintained at a predetermined temperature (for example, 400 degrees C.), thus driving the heater driving part 6 and controlling the power supplied to the heater 20. As the calculation value calculated based on the measurement value measured by the thermocouple 3 and the measurement value measured by the radiation temperature measuring part 4, for example, an average value of the measurement value measured by the thermocouple 3 and the measurement value measured by the radiation temperature measuring part 4 may be used. Also, for example, a proportional (RATIO) control may be used.

As described above, in this embodiment, for the film forming process, the control part 5 controls the power supplied to the heater 20 based on the measurement value measured by the radiation temperature measuring part 4. Further, for the loading process and the unloading process, the control part 5 controls the power supplied to the heater 20 based on the measurement value measured by the thermocouple 3. Thus, in the film forming process, the temperature control can be performed based on the temperature of the wafer measured with high precision, and in the loading process and the unloading process, the measurement value used in the temperature control can be suppressed from drastically fluctuating, thereby performing a stable temperature control.

Second Embodiment

In this embodiment, when a predetermined film forming process is performed on the wafer W, the control part 5 controls a power supplied to the heater 20 by performing a feedback control such that a measurement value measured by the radiation temperature measuring part 4 is maintained at a predetermined temperature. Further, when the wafer W is loaded into or unloaded from the process vessel 11, the control part 5 controls a power supplied to the heater 20, without referring to the measurement value measured by the thermocouple 3 and the measurement value measured by the radiation temperature measuring part 4.

Specifically, in the film forming process, the control part 5 performs the feedback control such that the measurement value measured by the radiation temperature measuring part 4 is maintained at a predetermined temperature (for example, 400 degrees C.), thus driving the heater driving part 6 and controlling the power supplied to the heater 20.

In the loading and unloading processes, the control part 5 controls the power supplied to the heater 20 to have a predetermined power.

As described above, in the second embodiment, for the film forming process, the control part 5 controls the power supplied to the heater 20 based on the measurement value measured by the radiation temperature measuring part 4. Also, for the loading process and the unloading process, the control part 5 controls the power supplied to the heater 20 to have the predetermined power. Thus, in the film forming process, the temperature control can be performed based on the temperature of the wafer measured with high precision, and in the loading process and the unloading process, the power supplied to the heater 20 can be suppressed from drastically fluctuating, thereby performing a stable temperature control.

Third Embodiment

In this embodiment, when a predetermined film forming process is performed on the wafer W, the control part 5 controls a power supplied to the heater 20 by performing a PID control such that a measurement value measured by the radiation temperature measuring part 4 is maintained at a predetermined temperature. Further, when the wafer W is loaded into or unloaded from the process vessel 11, the control part 5 controls the power supplied to the heater 20 by performing the PID control such that the measurement measured by the radiation temperature measuring part 4 is maintained at the predetermined temperature. Also, the control part 5 changes parameters of the PID control when the predetermined film forming process is performed on the wafer W and when the wafer W is loaded into or unloaded from the process vessel 11.

Specifically, the control part 5 changes the parameters of the PID control such that the reactivity to an increase or decrease in temperature in the loading and unloading processes is smaller than the reactivity to an increase or decrease in temperature in the film forming process.

As described above, in the third embodiment, the control part 5 controls the power supplied to the heater 20 based on the measurement value measured by the radiation temperature measuring part 4 in the film forming process, the loading process, and the unloading process. Also, in the loading and unloading processes, the control part 5 controls the parameters of the PID control such that the reactivity to an increase or decrease in temperature in the loading and unloading processes is smaller than the reactivity to an increase or decrease in temperature in the film forming process. Thus, in the film forming process, the temperature control can be performed based on the temperature of the wafer measured with high precision, and in the loading process and the unloading process, the power supplied to the heater 20 can be suppressed from drastically fluctuating, thereby performing a stable temperature control.

Fourth Embodiment

In this embodiment, when a predetermined film forming process is performed on the wafer W, the control part 5 corrects a measurement value measured by the thermocouple 3 using a calculation value calculated based on the measurement value measured by the thermocouple 3 and a measurement value measured by the radiation temperature measuring part 4. Further, the control part 5 controls the power supplied to the heater 20 by performing a feedback control such that the corrected value is maintained at a predetermined temperature. Further, when the wafer W is loaded into or unloaded from the process vessel 11, the control part 5 controls the power supplied to the heater 20 by performing a feedback control such that the measurement value measured by the thermocouple 3 is maintained at a predetermined temperature.

Specifically, the control part 5 measures a temperature of the wafer W using the thermocouple 3 and the radiation temperature measuring part 4, and calculates a difference between the measurement values in advance for each film forming condition in the film forming process. And then, in the film forming process, the control part 5 corrects a measurement value measured by the thermocouple 3 using the calculation value, and controls the power supplied to the heater 20 by performing the feedback control such that the corrected value is maintained at a predetermined temperature.

As described above, in the fourth embodiment, the control part 5 corrects the measurement value measured by the thermocouple 3 using the difference between the measurement value measured by the thermocouple 3 and the measurement value measured by the radiation temperature measuring part 4, which is calculated for each film forming condition in advance in the film forming process. Further, the control part 5 controls the power supplied to the heater 20 by performing the feedback control such that the corrected value is maintained at a predetermined temperature. Further, in the loading process and the unloading process, the control part 5 controls the power supplied to the heater 20 by performing the feedback control such that the measurement value measured by the thermocouple 3 is maintained at a predetermined temperature. Thus, in the film forming process, the temperature control can be performed based on the temperature of the wafer measured with high precision, and in the loading process and the unloading process, the power supplied to the heater 20 can be suppressed from drastically fluctuating, thereby performing a stable temperature control.

While the film forming apparatus has been described above based on the embodiments, the present disclosure is not limited thereto but may be variously modified and improved within the scope of the present disclosure.

For example, while in the above embodiments, the rotational direction of the rotary table 12 has been described to be the clockwise direction, the present disclosure is not limited thereto. In some embodiments, the rotational direction of the rotary table 12 may be a counterclockwise direction. The rotational direction of the rotary table 12 may be any direction as long as the wafer W is processed in a sequence of the first process region P1, the separation region D1, the second process region P2, and the separation region D2.

Further, while in the above embodiments, the $N_2$ gas has been described to be used as the separation gas discharged from the separation gas nozzles 22 and 24, the present disclosure is not limited thereto. In some embodiments, an inert gas such as an Ar gas or the like may be used as the separation gas.

Also, while in the above embodiments, the BTBAS gas has been described to be used as the gas discharged from the first reaction gas nozzle 21, the present disclosure is not limited thereto. In some embodiments, a silicon-containing gas such as trisdimethylaminosilane [3DMAS], dichlorosilane [DCS], hexachlorodisilane [HCD], or monoaminosilane; or a metal-containing gas such as titaniumtetrachloride [$TiCl_4$],titaniummethylpentanedionatobistetramethylheptanedionato [Ti(MPD)(THD)], trimethylaluminum [TMA], tetrakisethylmethylaminozirconium [TEMAZ], tetrakisethylmethylaminohafnium [TEMHF], or strontiumbistetramethylheptandionate [$Sr(THD)_2$] may be used instead of the BTBAS gas.

Further, while in the above embodiments, the $O_3$ gas has been described to be used as the gas discharged from the second reaction gas nozzle 23, the present disclosure is not limited thereto. In some embodiments, an oxygen-containing gas such as nitrogen oxide [NOx] or $H_2O$; or a nitrogen-containing gas such as $N_2$, ammonia [$NH_3$], hydrazine [$N_2H_4$], or methylhydrazine [$CH_6N_2$] may be used instead of the $O_3$ gas.

Further, for example, when the silicon-containing gas is used as the gas discharged from the first reaction gas nozzle 21 and the nitrogen-containing gas is used as the gas discharged from the second reaction gas nozzle 23, a nitride film such as SiN or the like is formed. Also, for example, when the titanium-containing gas is used as the gas discharged from the first reaction gas nozzle 21 and the nitrogen-containing gas is used as the gas discharged from the second reaction gas nozzle 23, a nitride film such as TiN or the like is formed.

Further, while in the above embodiments, the surface of the wafer W has been described to be plasmized by plasmizing the gas discharged from the second reaction gas nozzle 23, the present disclosure is not limited thereto. In some embodiments, the gas discharged from the second reaction gas nozzle 23 may be supplied without being plasmized According to the present disclosure in some embodiments, it is possible to provide a film forming apparatus which is capable of performing a temperature control with high precision.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A film forming apparatus for performing a predetermined film forming process on a plurality of substrates mounted on an upper surface of a rotary table installed within a process vessel along a rotational direction while rotating the rotary table and heating the plurality of substrates by a heating part, the apparatus comprising:

a contact type first temperature measuring part configured to measure a temperature of the heating part;

a non-contact type second temperature measuring part configured to measure a temperature of the plurality of substrates mounted on the rotary table; and a control part configured to control a power supplied to the heating part based on at least one of a first measurement value measured by the contact type first temperature measuring part and a second measurement value measured by the non-contact type second temperature measuring part, wherein the control part is configured to:

when the predetermined film forming process is performed on the plurality of substrates, control power supplied to the heating part by performing a feedback control such that the second measurement value measured by the second temperature measuring part is maintained at a first predetermined temperature, and when a loading process or an unloading process of the plurality of substrates with respect to the process vessel is performed, control the power supplied to the heating part by performing a feedback control such that an average value of the first measurement value measured by the first temperature measuring part and the second measurement value measured by the second temperature measuring part is maintained at a second predetermined temperature.

2. The apparatus of claim 1, wherein the first temperature measuring part is a thermocouple, and the second temperature measuring part is a temperature measuring part configured to detect an infrared ray radiated from the substrate.

3. The apparatus of claim 1, wherein the second temperature measuring part is configured to acquire temperature measurement values at a plurality of positions on the rotary table by repeating a scanning operation along a diameter direction of the rotary table while the rotary table is rotated.

* * * * *